United States Patent
Nagayama et al.

(10) Patent No.: US 8,040,054 B2
(45) Date of Patent: Oct. 18, 2011

(54) ORGANIC ELECTROLUMINESCENCE TYPE DISPLAY APPARATUS AND METHOD OF MANUFACTURING THE SAME

(75) Inventors: Kensuke Nagayama, Kumamoto (JP); Kazunori Inoue, Tokyo (JP); Nobuaki Ishiga, Kumamoto (JP)

(73) Assignee: Mitsubishi Electric Corporation (JP)

( * ) Notice: Subject to any disclaimer, the term of this patent is extended or adjusted under 35 U.S.C. 154(b) by 372 days.

(21) Appl. No.: 12/358,744

(22) Filed: Jan. 23, 2009

(65) Prior Publication Data
US 2009/0195151 A1 Aug. 6, 2009

(30) Foreign Application Priority Data
Jan. 31, 2008 (JP) .................. 2008-020501

(51) Int. Cl.
*H05B 33/00* (2006.01)
(52) U.S. Cl. .................. 313/506; 313/504
(58) Field of Classification Search .......... 313/498–512; 315/169.3; 345/36, 45, 76
See application file for complete search history.

(56) References Cited

U.S. PATENT DOCUMENTS

| | | | |
|---|---|---|---|
| 4,720,432 A | | 1/1988 | VanSlyke et al. |
| 5,320,913 A * | | 6/1994 | Morimoto et al. ............ 428/688 |
| 6,534,202 B2 * | | 3/2003 | Sato et al. .................... 428/690 |
| 7,381,984 B2 * | | 6/2008 | Suh et al. ...................... 257/40 |
| 2001/0011868 A1 | | 8/2001 | Fukunaga et al. |
| 2002/0000555 A1 | | 1/2002 | Fujikawa et al. |
| 2003/0234608 A1 | | 12/2003 | Lee et al. |
| 2004/0021414 A1 | | 2/2004 | Hanawa et al. |
| 2004/0126608 A1 | | 7/2004 | Gotoh et al. |
| 2005/0253507 A1 * | | 11/2005 | Fujimura et al. ............ 313/506 |
| 2006/0192481 A1 | | 8/2006 | Nagayama et al. |
| 2006/0240280 A1 * | | 10/2006 | Liao et al. .................... 428/690 |
| 2007/0096098 A1 * | | 5/2007 | Ishiga et al. .................. 257/59 |

FOREIGN PATENT DOCUMENTS

| | | |
|---|---|---|
| JP | 63-295695 | 12/1988 |
| JP | 4-253342 | 9/1992 |
| JP | 6-196736 | 7/1994 |
| JP | 2000-77666 | 3/2000 |
| JP | 2001-291595 | 10/2001 |
| JP | 2003-77681 | 3/2003 |
| JP | 2003-288993 | 10/2003 |
| JP | 2004-31324 | 1/2004 |
| JP | 2004-214606 | 7/2004 |
| JP | 2004-363556 | 12/2004 |

OTHER PUBLICATIONS

U.S. Appl. No. 12/887,865, Sep. 22, 2010, Inoue et al.

\* cited by examiner

*Primary Examiner* — Nimeshkumar Patel
*Assistant Examiner* — Christopher Raabe
(74) *Attorney, Agent, or Firm* — Studebaker & Brackett PC; Donald R. Studebaker

(57) ABSTRACT

An organic electroluminescence type display apparatus according to an aspect of the present invention includes: a thin film transistor formed on an insulating substrate; and an organic EL device connected to the thin film transistor and including at least an anode, an electroluminescence layer, and a cathode stacked on each other in this order. The anode includes: an Al alloy film having conductivity and including at least one kind of Group 8 3d transition metals, and oxygen, the at least one kind of the Group 8 3d transition metals and the oxygen being added to aluminum; and an amorphous ITO film formed on the Al alloy film.

17 Claims, 8 Drawing Sheets

ORGANIC ELECTROLUMINESCENCE TYPE DISPLAY APPARATUS AND METHOD OF MANUFACTURING THE SAME

BACKGROUND OF THE INVENTION

1. Field of the Invention

The present invention relates to an organic electroluminescence type display apparatus and a method of manufacturing the same. In particular, the present invention relates to an organic electroluminescence type display apparatus in which an organic electroluminescence (EL) device (hereinafter, referred to as "organic EL device") is formed as an electro-optic device on an active matrix type substrate having a thin film transistor (TFT) formed thereon, and to a method of manufacturing the same.

2. Description of Related Art

In recent years, an organic electroluminescence type display apparatus in which a light emitter such as an organic EL device is used as an electro-optic device has been commonly used as one of display panels. An organic EL device has a basic structure in which an electroluminescence layer including an organic EL layer is interposed between an anode electrode (also referred to as "anode") and a cathode electrode (also referred to as "cathode"). When a voltage is applied between the anode and the cathode, holes are injected from the anode side and electrons are injected from the cathode side, with the result that the organic EL layer emits light (see, for example, Japanese Patent No. 2597377 (Steven et al.)).

The organic electroluminescence type display apparatus which is a display apparatus incorporating such an organic EL device includes a TFT active matrix substrate on which a thin film transistor (hereinafter, referred to as "TFT") serving as a switching element is disposed. The organic EL device in which the anode, the electroluminescence layer, and the cathode are stacked on each other in this order is formed in each pixel of a display panel area on the active matrix substrate.

Examples of the conventionally commonly used organic electroluminescence type display apparatus include a so-called bottom emission type. In the organic electroluminescence type display apparatus of the bottom emission type, a TFT and an organic EL device are formed on a transparent insulating substrate such as a glass substrate. To emit light, which is generated from the organic EL layer of the organic EL device, to the back side of the transparent insulating substrate on which the TFT is not formed, the anode is made of a conductive material having a light-transmitting property, such as indium oxide $In_2O_3$+tin oxide $SnO_2$ (hereinafter, referred to as "ITO").

In order to increase the efficiency of hole injection into the organic EL layer, it is regarded as preferable that the anode be made of a conductive material having a high work function value. For example, Steven et Al. discloses that the preferable work function value for the anode is equal to or larger than 4.0 eV. ITO is preferably used as the material of the anode, because ITO has a work function value of about 4.7 eV.

In the bottom emission type, however, light is not allowed to be transmitted through a region in which a TFT pattern and a wiring pattern, which are formed on the substrate, a pattern of a signal driving circuit, and the like are formed. This causes a problem of a reduction in effective light-emitting area. To solve the problem, a structure called a top emission type capable of securing a wide light-emitting area has been developed.

In the organic electroluminescence type display apparatus of the top emission type, the anode is made of a metal material having light reflectivity. Accordingly, when the light generated in the organic EL layer is allowed to be transmitted through the cathode and is emitted to the upper portion of the substrate, the reflected light that is reflected on the anode made of the metal material can be emitted to the upper portion of the substrate at the same time. Thus, a bright display image can be obtained.

In order to obtain a high luminous efficiency and a bright image in the organic electroluminescence type display apparatus of the top emission type, the anode needs to have a high work function value and a high light reflectance. In view of patterning workability, Cr (about 4.5 eV) and Mo (about 4.6 eV), for example, can be selected as the metal material having a high work function value. However, those metal films have a problem in that the light reflectance is low and the loss of the reflected light is large when the films are applied to the anode. According to the measurements made by the inventors of the present invention, the light reflectance at a wavelength of 550 nm is 67% for Cr and 60% for Mo. Moreover, those materials have a high specific resistance value of 10 μΩ·cm or larger and a low hole injection efficiency, which causes a problem of a reduction in luminous efficiency.

On the other hand, as examples of the metal material having a high light reflectance of 90% or higher and a low specific resistance value of 10 μΩ·cm or smaller, Al, Ag, and an alloy of those metals can be selected. However, those metal films have a work function value smaller than the preferable work function value, that is, 4.0 eV, which causes a problem in that it is difficult to increase the luminous efficiency of the organic EL device.

To solve the above-mentioned problem, there is disclosed an anode which has at least a two-layer structure, in which a conductive material having a high work function is stacked on Ag or Al having a high light reflectance and a low specific resistance value, or an alloy thereof, and which has a structure satisfying both the high reflectance and the high hole injection efficiency (see, for example, Japanese Unexamined Patent Application Publication Nos. 2001-291595, 2003-77681, 2003-288993, and 2004-31324). Examples of the conductive material having a high work function include a metal oxide thin film. Many of them have a light-transmitting property and are advantageous in that the light reflectance of the metal of the lower layer does not greatly deteriorate.

When an Ag film or an Ag alloy film is used as the material having a high reflectance, however, those materials are chemically extremely active, and the reflectance greatly deteriorates with age due to the surface oxidation in the atmosphere. For this reason, it is difficult to apply those films to the real process.

Further, when the transparent conductive oxide film is formed as an upper layer on a metal film or an alloy film constituting a light reflective film as a lower layer, an oxide reaction layer including metal atoms of the lower metal film and oxygen contained in the upper layer is newly formed on an interface between the upper layer and the lower layer. The oxide reaction film is formed of an electrically insulating material, which causes a well-known problem that the resistance value of the device is abnormally increased as disclosed in Japanese Unexamined Patent Application Publication Nos. 04-253342, 06-196736, and 2000-77666.

FIG. 6 shows results of an experiment conducted by the inventors of the present invention on the dependency of the material of the metal film on the contact resistance between the metal film and the light-transmitting conductive oxide film. As is apparent from the graph shown in FIG. 6, the electrical contact resistance value on the interface in the case where the Al film and the Al alloy film, which is a light-transmitting conductive oxide film, according to a related art example are stacked on each other is extremely high, that is, the electrical contact resistance value of the related art example is 107 times as high as that of the case where Cr and the ITO film are stacked on each other according to Comparative Example 1, assuming that the value of the case where Cr and the ITO film are stacked on each other is 1.

Also in the case where the anode has a structure in which the ITO film is merely stacked on the Al alloy film, which is a lower layer, the oxide reaction layer, which is formed of an electrical insulating material, is formed on the interface. As a result, there is a problem in that the efficiency of hole injection into the organic EL layer remarkably deteriorates. In the case of the Al film, there is another problem in that surface irregularities such as hillock are more likely to occur, and a short-mode failure with the opposing cathodes sandwiching the organic EL layer and defective display called a dark spot are more likely to occur. The above-mentioned technologies fail to disclose any countermeasures against such problems. Therefore, it is substantially impossible to apply those technologies to the real device.

As a method for solving those problems, Japanese Unexamined Patent Application Publication No. 2004-214606 (Gotoh et al.) and Japanese Unexamined Patent Application Publication No. 2004-363556 (Ikeda et Al.), for example, disclose a method of reducing the electrical contact resistance with the transparent conductive film by adding Fe, Co, Ni, or the like to Al.

According to the methods disclosed in Gotoh et al. and Ikeda et al., for example, in an AlNi alloy in which Ni is added to Al, the formation of an oxide of Al on the interface of Al is prevented to obtain excellent contact resistance with the transparent conductive film. However, as a result of the experiment, the inventors of the present invention have found that there arises a problem that the transparent conductive film, for example, indium oxide of ITO is reduced and a part of the metal In separates out and becomes a dark spot, which results in defective display.

The present invention has been made in view of the above-mentioned circumstances, and therefore, an object of the present invention is to provide an organic electroluminescence type display apparatus capable of enhancing a luminous efficiency and obtaining a bright display image, and a method of manufacturing the same.

SUMMARY OF THE INVENTION

According to an aspect of the present invention, there is provided an organic electroluminescence type display apparatus including: a thin film transistor formed on an insulating substrate; and an organic electroluminescence (EL) device connected to the thin film transistor and including at least an anode, an electroluminescence layer, and a cathode stacked on each other in this order. The anode includes: an Al alloy film having conductivity and including at least one kind of Group 8 3d transition metals, and oxygen, the at least one kind of Group 8 3d transition metals and the oxygen being added to aluminum; and an amorphous ITO film formed on the Al alloy film.

According to another aspect of the present invention, there is provided a method of manufacturing an organic electroluminescence type display apparatus including: a thin film transistor formed on a substrate; and an organic EL device connected to the thin film transistor and including at least an anode, an electroluminescence layer, and a cathode stacked on each other in this order, the method including the step of forming the anode. The step of forming the anode includes the steps of: forming an Al alloy film having conductivity and including at least one kind of Group 8 3d transition metals, and oxygen, the at least one kind of the Group 8 3d transition metals and the oxygen being added to aluminum; and forming a transparent conductive film on the Al alloy film.

According to the present invention, it is possible to provide an organic electroluminescence type display apparatus capable of enhancing a luminous efficiency and obtaining a bright display image, and a method of manufacturing the same.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

As a result of a study to overcome these drawbacks, the inventors of the present invention have found that the addition of nitrogen or oxygen to an AlNi alloy prevents the reduction of a transparent conductive film, for example, indium oxide of ITO. The reason for this seems to be that the reduction of the transparent conductive film due to Ni is suppressed by adding nitrogen or oxygen.

Figure 1:
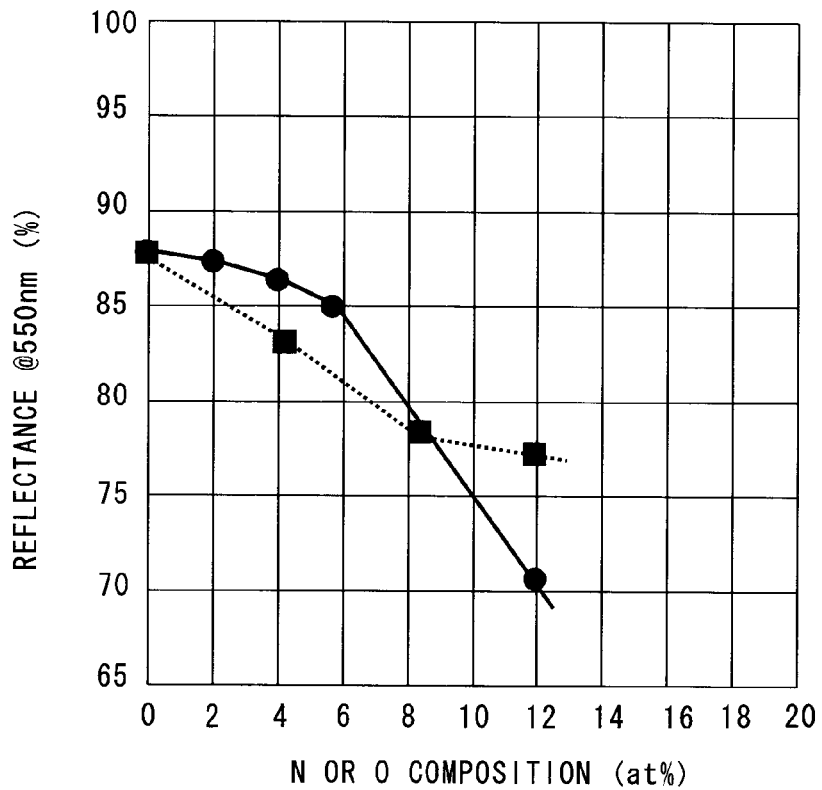
FIG. 1 is a graph showing dependency of the reflectance of an AlO film and an AlN film on O or N composition.

FIG. 1 is a graph showing a reduction in reflectance in the case where N or O is added to Al-2 at % Ni, which is the result obtained by the experiments conducted by the inventors of the present invention. As shown in FIG. 1, black circles represent the case where O is added, and black squares represent the case where N is added. As is apparent from FIG. 1, when N or O is added to Al-2 at % Ni, the reflectance decreases as the added amount increases. The inventors of the present invention have also found that the reduction in reflectance can be greatly suppressed when O is added, as compared with the case where N is added.

Figure 2:
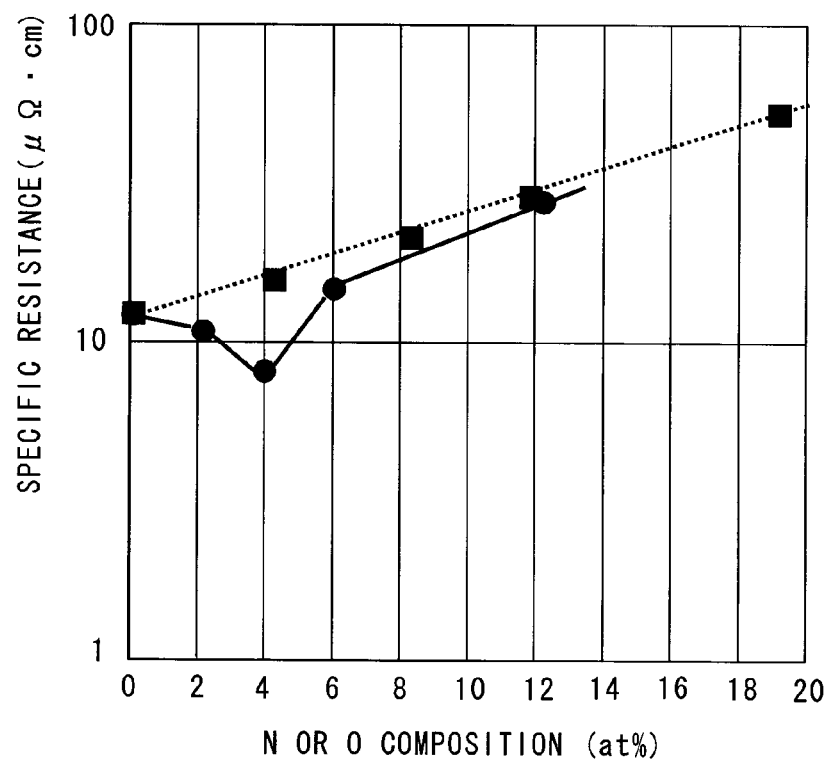
FIG. 2 is a graph showing a variation in specific resistance value in the case where N or O is added to AlNi.

FIG. 2 is a graph showing a variation in specific resistance value in the case where N or O is added to AlNi. As shown in FIG. 2, black circles represent the case where O is added, and black squares represent the case where N is added. As is apparent from FIG. 2, in the case where N is added, the specific resistance value monotonously increases as the added amount increases. Meanwhile, in the case where O is added, it is apparent that there is a region in which the specific resistance value decreases even when the added amount increases. The present invention has been made based on such findings.

Hereinafter, embodiments of the present invention will be described. The following description is given for purposes of illustration of embodiments of the present invention, and the present invention is not limited to the embodiments described below. For clarification of the explanation, the following description and the drawings are omitted and simplified as appropriate.

First Embodiment

Figure 3:
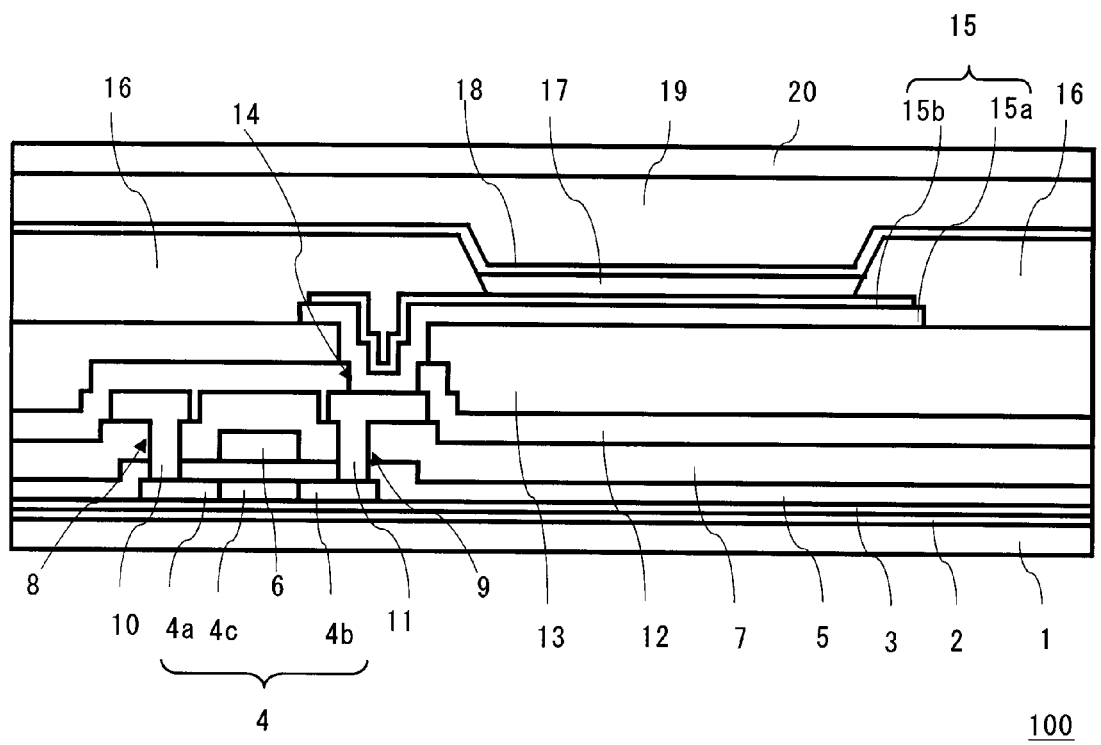
FIG. 3 is a diagram showing the structure of an organic electroluminescence type display apparatus according to a first embodiment of the present invention.

An organic electroluminescence type display apparatus according to a first embodiment of the present invention will be described with reference to FIG. 3. FIG. 3 is a cross-sectional view showing the structure of the organic electroluminescence type display apparatus according to this embodiment. Note that FIG. 3 shows, for purposes of illustration, a TFT substrate that constitutes the organic electroluminescence type display apparatus, and a pixel portion including an organic EL device formed on the TFT substrate. Referring to FIG. 3, an organic electroluminescence type display apparatus 100 according to this embodiment includes an insulating substrate 1, an SiN layer 2, an $SiO_2$ layer 3, a polysilicon film 4, a gate insulating film 5, a gate electrode 6, a first interlayer insulating film 7, a source electrode 10, a drain electrode 11, a second interlayer insulating film 12, a flattening film 13, an anode 15, a separation film 16, an electroluminescence layer 17, a cathode 18, a sealing layer 19, and an opposing substrate 20.

The insulating substrate 1 is a substrate having a light-transmitting property, such as a glass substrate or a quartz substrate. The SiN layer 2 and the $SiO_2$ layer 3, which are light-transmitting insulating films, are sequentially stacked and formed on the insulating substrate 1. Each of the SiN layer 2 and the $SiO_2$ layer 3 functions as a buffer layer for protecting a TFT described later from impurities diffusing from the insulating substrate 1.

The polysilicon film 4, which is a semiconductor film, is formed on the $SiO_2$ layer 3. The polysilicon film 4 is formed in an island shape on the $SiO_2$ layer 3. The polysilicon film 4 includes a source region 4a, a drain region 4b, and a channel region 4c. The gate insulating film 5 is formed to cover the $SiO_2$ layer 3 and the polysilicon film 4. The gate electrode 6 is formed on the gate insulating film 5.

The first interlayer insulating film 7 made of $SiO_2$ or the like is formed on the gate electrode 6. The first interlayer insulating film 7 and the gate insulating film 5 have contact holes 8 and 9 formed through the films. The contact hole 8 is opened to expose the source region 4a formed therebelow. The contact hole 9 is opened to expose the drain region 4b formed therebelow.

The source electrode 10 and the drain electrode 11 are formed on the first interlayer insulating film 7. The source electrode 10 is connected to the source region 4a via the contact hole 8 formed in the first interlayer insulating film 7 and the gate insulating film 5. The drain electrode 11 is connected to the drain region 4b via the contact hole 9 formed in the first interlayer insulating film 7 and the gate insulating film 5. The second interlayer insulating film 12 made of SiN, $SiO_2$, or the like is formed on the source electrode 10, the drain electrode 11, and the first interlayer insulating film 7.

Further, the flattening film 13 made of organic resin is formed on the second interlayer insulating film 12 in order to flatten the surface.

Each of the second interlayer insulating film 12 and the flattening film 13 has a contact hole 14 and an opening formed therein to expose the drain electrode 11 formed therebelow. The anode 15 is formed on the flattening film 13. The anode 15 is connected to the drain electrode 11 formed therebelow, via the contact hole 14 and the opening which are formed in each of the second interlayer insulating film 12 and the flattening film 13. The anode 15 has a structure in which an Al alloy film 15a serving as a first anode and an amorphous ITO film 15b serving as a second anode formed thereon are stacked on each other. The Al alloy film 15a contains at least one kind of Group 8 3d transition metals and oxygen and has conductivity. The amorphous ITO film 15b is a light-transmitting conductive oxide film (transparent conductive film) containing a metal oxide as a main component. The structure of the anode 15 will be described later.

Figure 4:
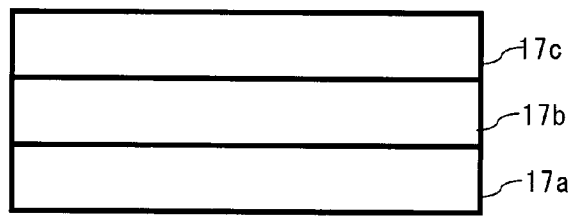
FIG. 4 is a diagram showing a structural example of an organic EL layer according to the first embodiment.

The separation film 16 is formed on the anode 15 and the flattening film 13. The separation film 16 is formed in a bank shape like a frame around each pixel so that adjacent pixels are separated from each other. The separation film 16 has an opening for exposing the anode 15. In the opening of the separation film 16, the electroluminescence layer 17 made of an organic EL material is formed in contact with the anode 15. As shown in FIG. 4, the electroluminescence layer 17 has a three-layer structure in which a hole transport layer 17a, an organic EL layer 17b, and an electron transport layer 17c are stacked on each other in this order. Note that the electroluminescence layer 17 may have a well-known structure in which at least one of a hole injection layer (not shown) interposed between the hole transport layer 17a and the anode 15, and an electron injection layer (not shown) formed immediately above the electron transport layer 17c is added. In this case, the electroluminescence layer 17 is formed in a four-layer or five-layer structure.

The cathode 18 is formed on the separation film 16 and the electroluminescence layer 17. The anode 15, the electroluminescence layer 17, and the cathode 18 are stacked on each other to form an EL device. The organic electroluminescence type display apparatus includes a plurality of organic EL devices formed in a matrix. The cathode 18 is formed of ITO or the like. A current flows in the electroluminescence layer 17 due to a potential difference between the anode 15 and the cathode 18. The sealing layer 19 is formed on the cathode 18. The sealing layer 19 is formed so as to isolate the electroluminescence layer 17 from moisture and impurities. The opposing substrate 20 is formed on the sealing layer 19 in such a manner that the opposing substrate 20 faces the insulating substrate 1.

In the organic electroluminescence type display apparatus shown in FIG. 3, a signal voltage transmitted from the source electrode 10 is applied to the anode 15 via the drain electrode 11. When the current flows through the electroluminescence layer 18 due to the potential difference between the anode 15 and the cathode 18, the organic EL layer emits light. As a result, light necessary for display can be obtained.

In this embodiment, the Al alloy film 15a serving as the first anode of the anode 15 contains as an impurity at least one kind of the Group 8 3d transition metals to be added to Al having a high light reflectance, and also contains oxygen added thereto by a reactive sputtering method. Further, the Al alloy film 15a has conductivity. The anode 15 is formed as at least a two-layer film in which the amorphous ITO film 15b is formed on the Al alloy film 15a. Thus, on an interface between the Al alloy film 15a and the amorphous ITO film 15b, no electrically insulating interface reaction product such as alumina exists, and deposit of metallic indium due to the reduction of indium oxide does not occur.

Further, in the Al alloy film 15a, the composition ratio of impurities including at least one kind of the Group 8 3d transition metals is set within the range of 0.1 at % to 15 at %, and the composition ratio of oxygen is set within the range of 0.1 at % to 8 at %. As a result, it is possible to obtain the anode 15 which has a high light reflectance and has no dark spot occurring due to the reduction of the amorphous ITO film 15b which is a transparent conductive film. Thus, the reflectance of light emitted from the organic EL device can be enhanced, and the efficiency of hole injection into the electroluminescence layer 17 can also be enhanced. Therefore, it is possible to obtain an organic electroluminescence type display apparatus having a high luminous efficiency and capable of obtaining a bright display image.

Next, a method of manufacturing the organic electroluminescence apparatus according to this embodiment will be described with reference to FIGS. 5A to 5H. FIGS. 5A to 5H are manufacturing process cross-sectional views for illustrating the method of manufacturing the organic electroluminescence type display apparatus according to this embodiment. Note that only a p-type transistor is illustrated in FIGS. 5A to 5H for ease of explanation.

Figure 5A:
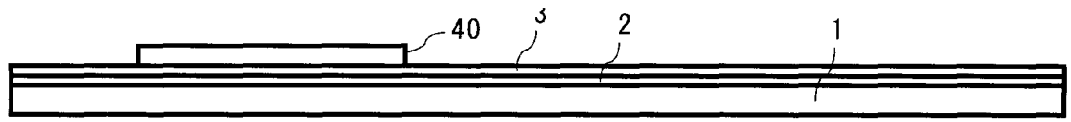
FIGS. 5A to 5H are manufacturing process cross-sectional views for illustrating a method of manufacturing the organic electroluminescence type display apparatus according to the first embodiment.

Referring first to FIG. 5A, the SiN film 2, the $SiO_2$ film 3, and an amorphous silicon film 40 are formed in this order on the main surface of the insulating substrate 1 by using a plasma CVD (Chemical Vapor Deposition) method.

Note that, after the formation of the amorphous silicon film 40, heat treatment may be carried out to reduce the concentration of hydrogen (H) contained in the amorphous silicon film 40. In this case, it is possible to prevent the occurrence of cracks due to bumping of hydrogen contained in the amorphous silicon film 40 in a subsequent laser annealing step.

Figure 5B:
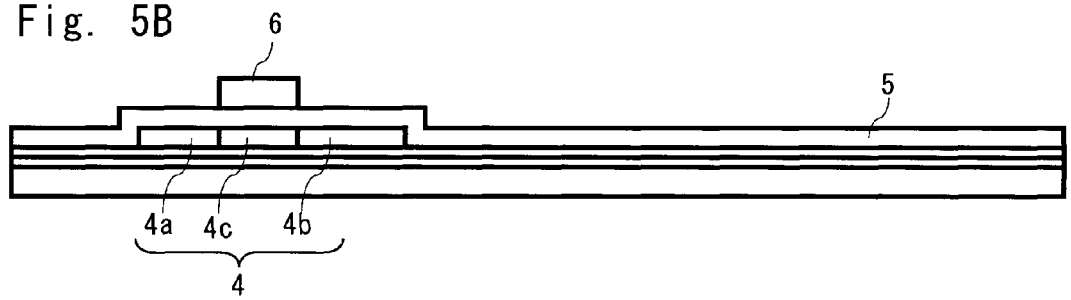

Referring then to FIG. 5B, a laser beam having a wavelength of 308 nm and emitted from an excimer laser is irradiated to the amorphous silicon film 40. In this case, the laser beam passes through a predetermined optical system and is converted into a linear beam profile. After that, the light beam is irradiated to the amorphous silicon film 40. By the laser annealing step, the amorphous silicon film 40 is made into a polycrystalline silicon film, thereby forming the polysilicon film 4.

Note that, in this embodiment, a pulse type excimer laser is used as a means for making the amorphous silicon film 40 into a polycrystalline silicon film, but the means is not limited thereto. For example, a YAG laser and a continuous-wave laser (CW laser) may be used. Further, the amorphous silicon film 40 can be made into a polycrystalline silicon film by carrying out thermal annealing. In the case of carrying out thermal annealing, the use of a catalyst such as nickel (Ni) enables the obtainment of the polysilicon film 4 with larger grain size.

Next, a resist film (not shown) having a predetermined opening pattern is formed on the polysilicon film 4. The polysilicon film 4 is etched using the resist film as a mask, and is formed in a predetermined shape. After that, the resist film is removed.

Then, the gate insulating film 5 that covers the polysilicon film 4 is formed by the plasma CVD method. Further, a metal film serving as the gate electrode 6 is formed on the gate insulating film 5 by using a sputtering method. A resist film (not shown) having a predetermined opening pattern is formed on the metal film. The metal film is etched using the resist film as a mask, thereby forming the gate electrode 6. Then, the resist film is removed.

After that, a predetermined does of boron is injected to the polysilicon film 4 by using an ion doping method. In this case, the gate electrode 6 is used as a mask, and boron is injected to both end portions of the polysilicon film 4. As a result, the source region 4a and the drain region 4b are formed in the polysilicon film 4. Further, a portion into which boron is not injected serves as the channel region 4c.

Figure 5C:

Referring then to FIG. 5C, the first interlayer insulating film 7 that covers the gate electrode 6 is formed on the gate insulating film 5. Further, a resist film (not shown) having a predetermined opening pattern is formed on the first interlayer insulating film 7. The first interlayer insulating film 7 and the gate insulating film 5 are etched using the resist film as a mask, thereby forming the contact holes 8 and 9 which reach the source region 4a and the drain region 4b, respectively. After that, the resist film is removed.

Figure 5D:
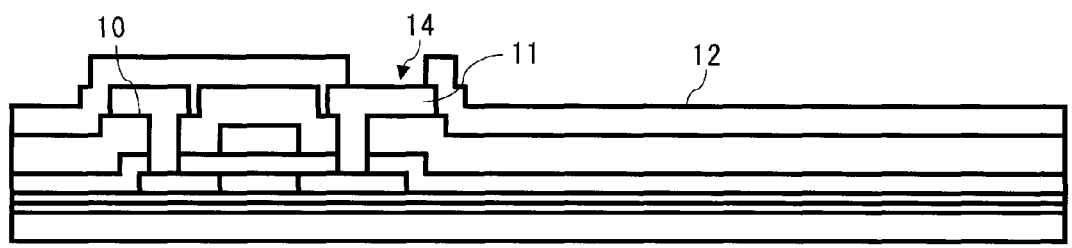

Referring then to FIG. 5D, the source electrode 10 and the drain electrode 11 each having a predetermined shape are formed on the first interlayer insulating film 7. The source electrode 10 and the source region 4a are connected to each other via the contact hole 8, and the drain electrode 11 and the drain region 4b are connected to each other via the contact hole 9. After the formation of the source electrode 10 and the drain electrode 11, the electrodes are exposed to a hydrogen plasma atmosphere for 30 minutes. Through the step, defects present in the polysilicon film 4 can be terminated by hydrogen (H), thereby making it possible to form a transistor with high reliability and high performance.

Then, the second interlayer insulating film 12 that covers the source electrode 10 and the drain electrode 11 is formed on the first interlayer insulating film 7 by using the plasma CVD method. A resist film (not shown) having a predetermined opening pattern is formed on the second interlayer insulating film 12. The second interlayer insulating film 12 is etched using the resist film as a mask, thereby forming the contact hole 14 that reaches the drain electrode 11. After that, the resist film is removed.

Figure 5E:
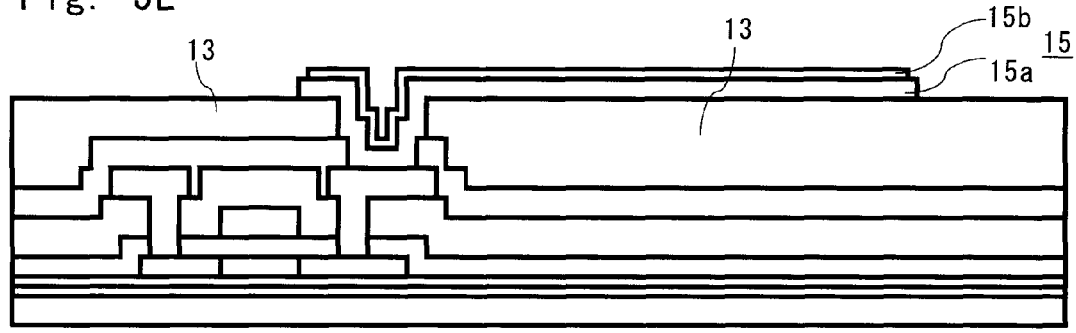

Referring then to FIG. 5E, the flattening film 13 having an opening, which reaches the drain electrode 11 to overlap a part or the whole of the contact hole 14, is formed on the second interlayer insulating film 12. An organic resin film, for example, a light-transmitting acrylic photosensitive resin film known by the brand name "PC335", which is manufactured by JSR Corporation, can be used as the flattening film 13. The organic resin film is coated and formed by using a spin coat method so that a film thickness of about 2 μm is obtained, and then the opening that reaches the drain electrode 11 is formed using a photolithography method. After that, annealing is conducted at 220° C. in order to cure the flattening film 13. As a result, the flattening film 13 having the predetermined opening is formed. The flattening film 13 is formed in such a manner to cover irregularities on the surface of each of the gate electrode 6, the source electrode 10, the drain electrode 11, and the like, thereby making it possible to flatten the array surface.

Then, the anode 15 is formed on the flattening film 13. Specifically, the Al alloy film 15a is first formed as the first anode of the anode 15.

In this example, the Al alloy film 15a in which 2 at % of nickel is added to aluminum as an impurity and 2 at % of oxygen is added and which has conductivity, was deposited with a thickness of 50 nm by reactive sputtering using a target in which nickel (Ni) is added to aluminum (Al) and using a deposition gas in which oxygen (O) is mixed with argon (Ar) as an impurity. Subsequently, the amorphous ITO film 15b, which is a light-transmitting conductive oxide film, was deposited as the second anode of the anode 15 with a thickness of 20 nm on the Al alloy film 15a.

After that, a resist film having a predetermined opening pattern is formed on the anode 15 by a photolithography process. The anode 15 is etched using the resist film as a mask. The amorphous ITO film 15b and the Al alloy film 15a containing oxygen and having conductivity are first etched using a solution containing oxalic acid and subsequently etched using a solution containing phosphoric acid+nitric acid+acetic acid. After that, the resist film is removed. Thus, the anode 15 having the two-layer structure of the Al alloy film 15a and the amorphous ITO film 15b each having a desired pattern is formed.

Note that, in this embodiment, Ni is added to Al as an impurity, but the impurity is not limited thereto. For example, any impurity may be used as long as at least one of Fe and Co, which are other kinds of the Group 8 3d transition metals, is added. When at least one kind of the Group 8 3d transition metals is added to Al, the formation of an insulating oxide reaction layer on the interface with the light-transmitting conductive oxide film stacked thereon can be suppressed, and the deterioration of the hole injection efficiency can be prevented.

Figure 6:
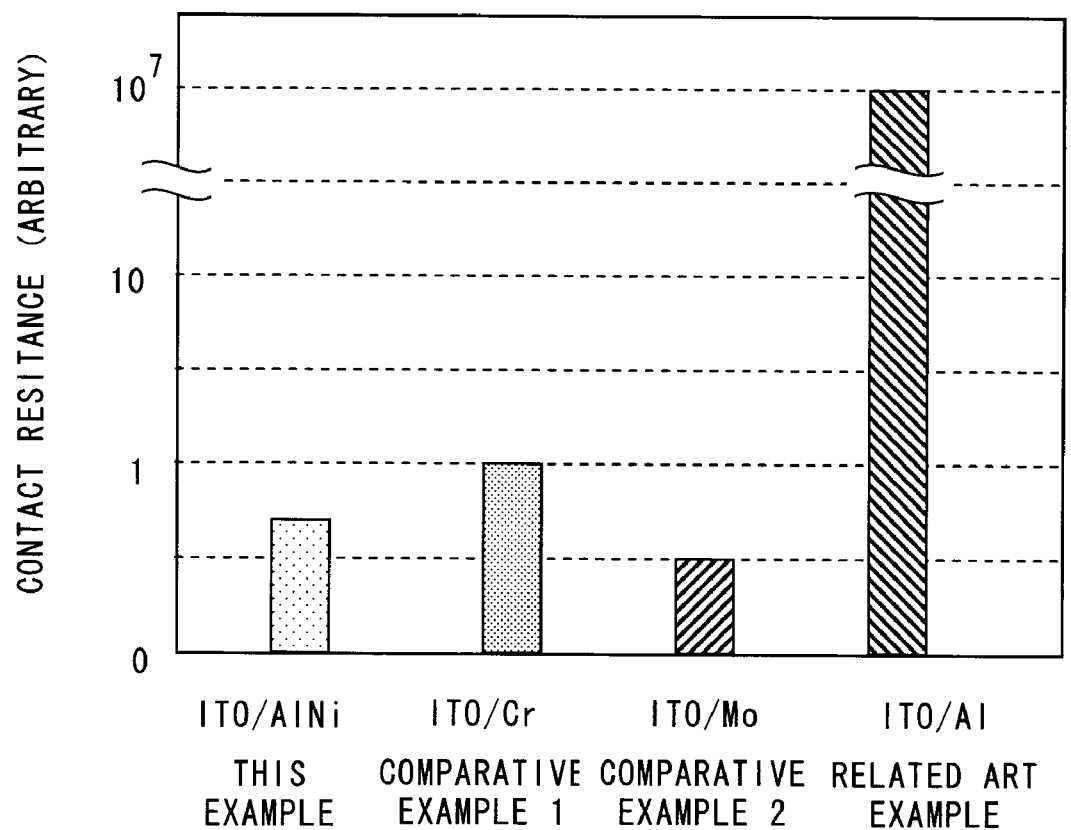
FIG. 6 is a graph showing contact resistance values between a light-transmitting conductive oxide film and an anode metal film.

FIG. 6 shows the experimental results on the dependency on the material of the metal film in a contact resistance value between the metal film and the light-transmitting conductive oxide film. Referring to FIG. 6, it is obvious that the contact resistance according to this example where the ITO film is stacked on the Al alloy film in which Ni is added to Al is greatly reduced compared to the contact resistance according to the related art example where the ITO film and the Al film in which Ni is not added are stacked on each other. Further, the contact resistance value according to this example is substantially the same as the contact resistance value obtained in the case where Mo and Cr, which are high-melting metals, and the ITO film are stacked on each other as illustrated in Comparative Examples 1 and 2.

As described above, when 1.0 at % or more of Ni is added to Al, the formation of the insulating oxide reaction layer between the Al alloy film and the ITO film, which is a light-transmitting conductive oxide film, can be suppressed. Therefore, excellent electrical contact characteristics can be obtained.

Figure 7:
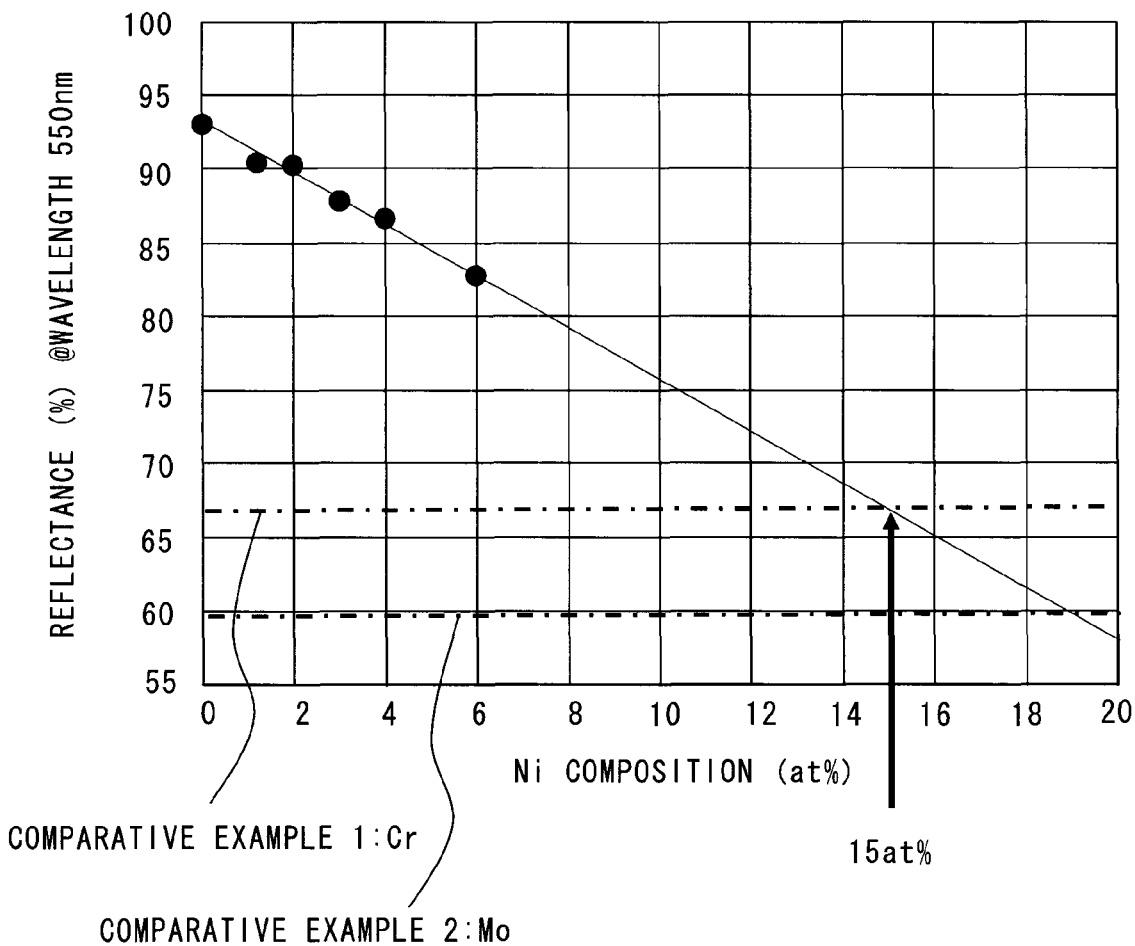
FIG. 7 is a graph showing dependency of the reflectance of an AlNi film on Ni composition.

FIG. 7 shows the dependency of the light reflectance of the Al alloy film on Ni composition at a wavelength of 550 nm. Referring to FIG. 7, it is obvious that the reflectance of the Al alloy film decreases as the amount of Ni added increases. When the amount of Ni added is equal to or smaller than 15 at %, the light reflectance of the Al alloy film can be set to be equal to or higher than the light reflectance of Cr according to Comparative Example 1 and that of Mo according to Comparative Example 2. Thus, the light emitted from the electroluminescence layer 17 is reflected on the Al alloy film, which contributes to display light. Accordingly, the composition ratio of Ni added to Al of the Al alloy film 15a is preferably within the range of 0.1 at % to 15 at %.

Further, in this embodiment, the Al alloy film in which 2 at % of O is added as an impurity in addition to Ni is used as the Al alloy film 15a, but the Al alloy film 15a is not limited thereto. The amount of O added is desirably within the range of 0.1 at % to 8 at %. When 0.1 at % or more of O is added, the reduction of the amorphous ITO film 15b, which is a transparent conductive film, due to Ni can be suppressed. As a result, defective display due to dark spots can be prevented.

FIG. 1 shows the dependency of the light reflectance of the Al alloy film on O composition at a wavelength of 550 nm. Referring to FIG. 1, it is obvious that the reflectance of the Al alloy film decreases as the amount of O added increases. When the amount of O added is equal to or smaller than 8 at %, the light reflectance of the Al alloy film can be set to be equal to or higher than the light reflectance obtained in the case where N is added. Thus, the light emitted from the electroluminescence layer 17 is reflected on the Al alloy film, which contributes to the display light. Accordingly, the composition ratio of O added to Al of the Al alloy film 15a is preferably within the range of 0.1 at % to 8 at %.

Moreover, it is desirable to further add at least one rare earth element selected from the group consisting of Y, La, Ce, Pr, Nd, Sm, Gd, Tb, Dy, Ho, and Er to the Al alloy film 15a. The addition of these impurities improves the heat resistance of the Al alloy film 15a and suppresses the formation of surface irregularities such as hillock. For this reason, an electrical short-circuit between the anode and the cathode due to surface irregularities can be prevented. As a result, the occurrence of defective display such as a so-called dark spot can be suppressed and the display quality can be improved. Further, the composition ratio of at least one rare earth element selected from the group consisting of Y, La, Ce, Pr, Nd, Sm, Gd, Tb, Dy, Ho, and Er added to the Al alloy film 15a is preferably equal to or larger than 0.1 at % and less than 15 at %, and the total composition ratio of the rare earth element and the Group 8 3d transition metal is preferably equal to or smaller than 15 at %.

Figure 8:
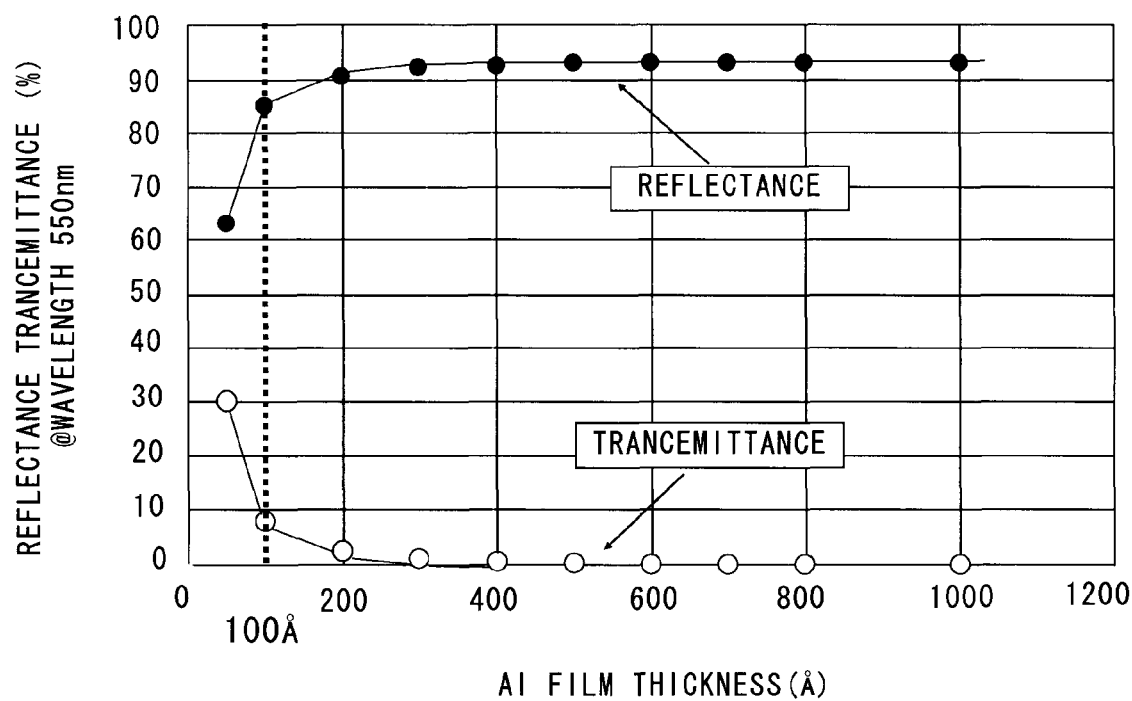
FIG. 8 is a graph showing a relation between the reflectance, transmittance, and thickness of an Al film.

Though the thickness of the Al alloy film 15a is 50 nm in this embodiment, the thickness is not limited thereto, as long as the thickness is within the range of 10 nm to 200 nm. FIG. 8 shows the dependency of the Al film on the film thickness with respect to the light reflectance and the light transmittance of the Al alloy film at a wavelength of 550 nm. As is apparent from FIG. 8, when the Al alloy film has a thickness of 10 nm or greater, the light transmittance can be substantially reduced, and the light reflectance of the Al alloy film can be set to be equal to or higher than that of Cr and Mo illustrated in Comparative Examples 1 and 2. Accordingly, the light emitted from the electroluminescence layer 17 is reflected on the Al alloy film, which contributes to the display light. Further, as the thickness of the Al alloy film increases, the grain size increases and the surface irregularities become larger. Thus, when the Al alloy film is used as the anode of the organic electroluminescence type display apparatus, defective coating is caused by the electroluminescence layer 17, which leads to a short mode failure with the cathode 18, for example. As for the target of the surface smoothness of the anode 15, it is preferable that the average roughness Ra be equal to or smaller than 1.0 nm. From this viewpoint, it is preferable that the thickness of the Al alloy film 15a be equal to or smaller than 200 nm.

Though the thickness of the amorphous ITO film 15b is 20 nm, the thickness is not limited thereto. The film thickness may be equal to or greater than 3.5 nm. If the film thickness is equal to or greater than 3.5 nm, it is possible to form a uniform film grown on the layer, which is effective in preventing defective display caused by a defective film.

The amorphous ITO film 15b has not only a function of enhancing the hole injection efficiency but also a function of acting as a component of an optical path in the case where the light emitted from the electroluminescence layer 17 is reflected on the surface of the Al alloy film 15a of the anode 15. Accordingly, it is preferable that the thickness of the amorphous ITO film 15b be set so that a high luminous efficiency can be obtained while consideration is given to the interference effect of the component of light, which is sent from the organic EL layer 17b serving as a light emitting layer and directly emitted to the cathode 18 side, with the component of light, which is reflected on the Al alloy film 15a of the anode 15 and emitted to the cathode 18 side. Further, in the case where the hole transport layer 17a and the like are formed below the organic EL layer 17b of the electroluminescence layer 17 as described later, it is preferable that each of the thicknesses of these layers be set according to the optical path formed in the stacked structure of these films and the amorphous ITO film 15b.

As described above, the stacked films of the amorphous ITO film 15b, which is a light-transmitting conductive film deposited with a preferable thickness, and the Al alloy film 15a, which contains oxygen and has conductivity, are etched using the resist film, which is formed by the photolithography process and has the predetermined pattern, as a mask. The anode 15 is first etched using a solution containing oxalic acid and subsequently etched using a solution containing phosphoric acid+nitric acid+acetic acid. In this manner, the anode 15 is formed into a desired pattern. In the etching process using the solution containing phosphoric acid+nitric acid+acetic acid, the etching rate of the amorphous ITO film 15b is lower than that of the Al alloy film 15a. Thus, the cross section of the pattern of the anode 15 is formed in an eaves shape in which a lower layer portion of the Al alloy film 15a becomes narrower and an upper layer portion of the amorphous ITO film 15b becomes wider. That is, the pattern of the amorphous ITO film 15b is larger than the pattern of the Al alloy film 15a, which is a lower layer, by the size of the eaves. Accordingly, the pattern of the amorphous ITO film 15b is formed into a shape involving the pattern of the Al alloy film 15a.

Figure 5F:
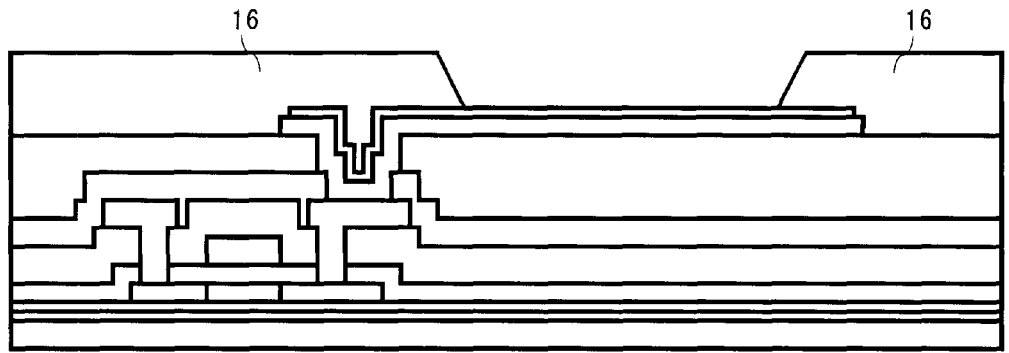

If the separation film 16 is formed on the anode 15 as shown in FIG. 5F while the eaves shape is left as it is, a cavity is formed in the lower portion of the eaves of the anode 15. Accordingly, there is a possibility that the moisture and impurities such as bubbles involved in the cavity deteriorate the electroluminescence layer 17. Thus, before the resist film is removed, an etching process, in which etching is conducted in a solution containing oxalic acid, may be added. Oxalic acid has a selectivity for etching the amorphous ITO film 15b but not etching the Al alloy film 15a which contains oxygen and has conductivity. Through such a process, the eaves shape of the amorphous ITO film 15b, which is usually formed in the edge portions of the pattern of the anode 15, is improved and formed into a substantially linear shape or a step shape as shown in FIG. 5E. Therefore, it is possible to enhance the coatability of the separation film 16 formed in the later process, and it is possible to prevent the impurities, which may cause the deterioration of the electroluminescence layer 17, from being involved in the film.

Though the amorphous ITO film 15b is used as a light-transmitting conductive oxide film in this embodiment, the amorphous ITO film 15b is not limited thereto. Indium oxide ($In_2O_3$), tin oxide ($SnO_2$), zinc oxide (ZnO), and any material having those oxides mixed therein may be used. Since those materials can be etched in a solution containing phosphoric acid+nitric acid+acetic acid, the film made of those materials can be etched together with the Al alloy film 15a, which is effective to simplify the process. Furthermore, compared to an ITO film, an $In_2O_3$ film, and an $SnO_2$ film, the ZnO film is low in the reactivity at the interface with the Al alloy film 15a. Accordingly, the quantity of aggregate generated on the interface is small. The aggregate causes defective display on the panel, and the generation of the aggregate proceeds by the continuous lighting of the panel. Thus, the technique of suppressing the generation of the aggregate generated on the interface is highly advantageous in that a high quality of display on the panel and high reliability can be obtained.

Further, the light-transmitting conductive oxide film may be made of a material (ITZO) in which indium oxide, tin oxide, and zinc oxide are mixed with each other. In the case of the ITZO film, as in the case of the ZnO film, the reactivity at the interface with the Al alloy film 15a is low, which is highly effective to suppress the generation of the aggregate on the interface. Further, in the case of the ITZO film, as in the case of the amorphous ITO film, the ITZO film can be crystallized by heat treatment, which results in producing an effect of improving the chemical stability.

Next, as shown in FIG. 5F, in order to secure a region in which the electroluminescence layer 17 shown in FIG. 3 is formed being separated into each pixel portion, an organic resin film made of polyimide or the like is coated and formed on the flattening film 13 and the anode 15, and then the separation film 16 is formed by the photolithography process. The separation film 16 is formed in a frame shape so as to surround each pixel region, and is formed in a bank-like protrusion so that pixels (not shown), which are adjacent to each other, are separated from each other. The organic resin film forming the separation film 16 is preferably made of a polyimide-based material which hardly absorbs moisture which has an adverse effect on the characteristics and reliability of the organic EL layer 17b. In this embodiment, the material known by the brand name "DL100", which is manufactured by TORAY INDUSTRIES, INC., was coated with a film thickness of about 2 μm, and the frame-shaped separation film 16 was formed in a frame shape by the photolithography process.

Figure 5G:
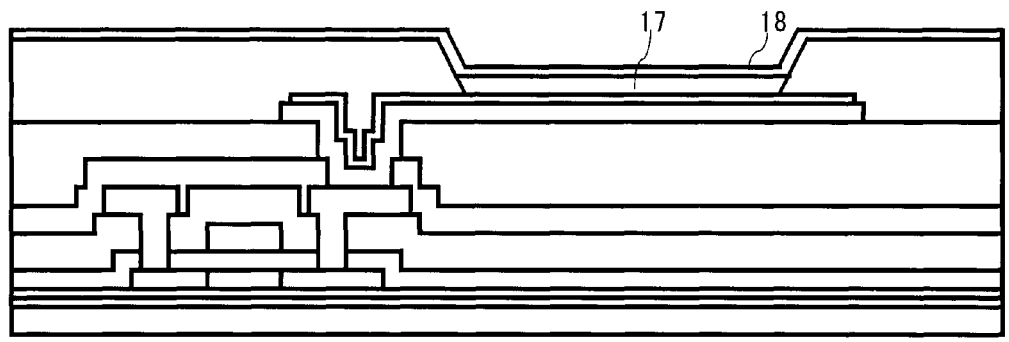

Next, as shown in FIG. 5G, an organic material serving as the electroluminescence layer 17 is formed in the pixel region by using a method such as vapor deposition. In this embodiment, the electroluminescence layer 17 is formed in such a manner that the hole transport layer 17a, the organic EL layer 17b, and the electron transport layer 17c are stacked on each other in this order as shown FIG. 4. The material of the hole transport layer 17a can be selected from a wide range of well-known organic materials such as triallyl amine, aromatic hydrazon, aromatic substituted pyrazoline, and stilbene. For example, N,N-diphenyl-N,N-bis (3-methylphenyl)-1,1'-diphenyl-4,4'diamine (TPD) is formed into a film with a thickness within the range of 1 to 200 nm.

Examples of well-known materials of the organic EL layer 17b include dicyanomethylene pyrane derivative (emitting red light), coumalin (emitting green light), quinacridon (emitting green light), teraphenylbutadiene (emitting blue light), and distyryl benzene (emitting blue light). One of those materials is formed into the organic EL layer 17b with a thickness in the range of 1 to 200 nm. Examples of the material of the electron transport layer 17c include oxaziazole derivative, triazole derivative, and coumalin derivative which are well-known. One of those materials is formed into a film with a film thickness within the range of 1 to 200 nm. The electron transport layer 17c is made of a material selected from the well-known materials such as oxadiazole derivative, triazole derivative, and coumalin derivative with a film thickness in the range of 0.1 to 200 nm.

Though the electroluminescence layer 17 has the structure in which the hole transport layer 17a, the organic EL layer 17b, and the electron transport layer 17c are sequentially stacked in the above embodiment, the structure of the electroluminescence layer 17 is not limited thereto. In order to enhance the luminous efficiency of the electroluminescence layer 17, another hole injection layer may be formed between the hole transport layer 17a and the anode 15. Alternatively, it is possible to employ a well-known structure in which an electron injection layer is formed between the electron transport layer 17c and the cathode 18 described later.

Next, as shown in FIG. 5G, the ITO film, which is a transparent conductive film, is formed as the cathode 18 with a thickness of 100 nm by the sputtering method. The cathode 18 is connected to the electroluminescence layer 17 formed therebelow in the pixel region. Further, the cathode 18 is connected to a cathode grounding electrode (not shown) formed therebelow, via a contact hole (not shown). It is preferable that the surface of the cathode 18 have high flatness. Accordingly, it is preferable to form an amorphous ITO film, in the film structure of which no grain boundary is formed. The amorphous ITO film can be formed by, for example, sputtering in a gas in which an $H_2O$ gas is mixed with an Ar gas. It is also possible to use an IZO film in which indium oxide and zinc oxide are mixed with each other, or an ITZO film in which zinc oxide is mixed with an ITO film.

Figure 5H:
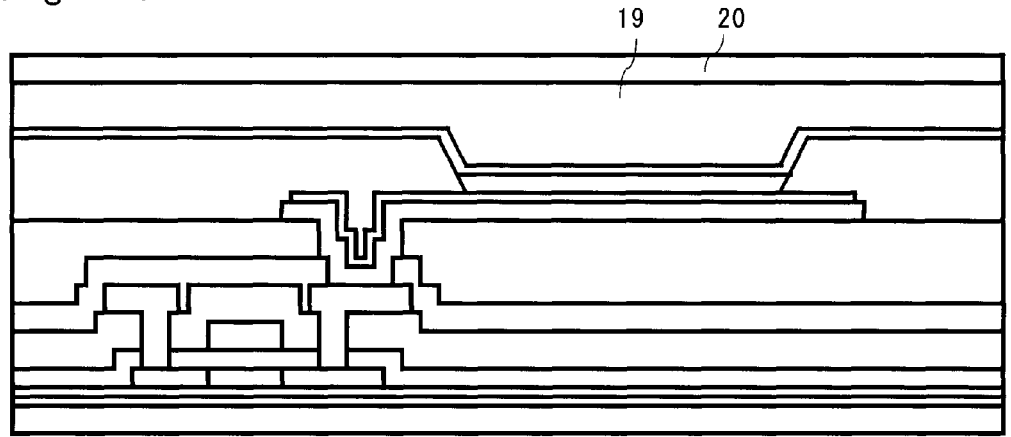

Lastly, as shown in FIG. 5H, in order to prevent the deterioration of the light-emitting property of the electroluminescence layer 17 due to moisture and impurities, the entire pixel region, on which the electroluminescence layer 17 is formed, is covered with the sealing layer 19, and the opposing substrate 20 is disposed on the sealing layer 19. Thus, the organic electroluminescence type display apparatus according to this embodiment is completed.

Note that, in the above embodiment, the polysilicon film 4 is used as the semiconductor film of the TFT serving as a switching element for driving a pixel, but the semiconductor film is not limited thereto. Alternatively, an amorphous silicon film may be used. Further, the structure of the TFT is not limited to the top gate type as illustrated in the first embodiment, and a structure such as a bottom gate inverted staggered type may be employed. Furthermore, only one TFT is illustrated in the first embodiment, but a plurality of TFTs may be provided for each pixel.

In the first embodiment, the Al alloy film 15a serving as the first anode of the anode 15 is formed by the reactive sputtering method using the target in which nickel is added to aluminum and using the deposition gas in which oxygen is added to argon as an impurity, but the method of forming the Al alloy film 15a is not limited thereto. The same effects can be obtained even if, for example, the Al alloy film 15a is formed by the sputtering method using a target in which a Group 8 3d transition metal and oxygen are added to Al and using Ar as a deposition gas.

Second Embodiment

Figure 9:
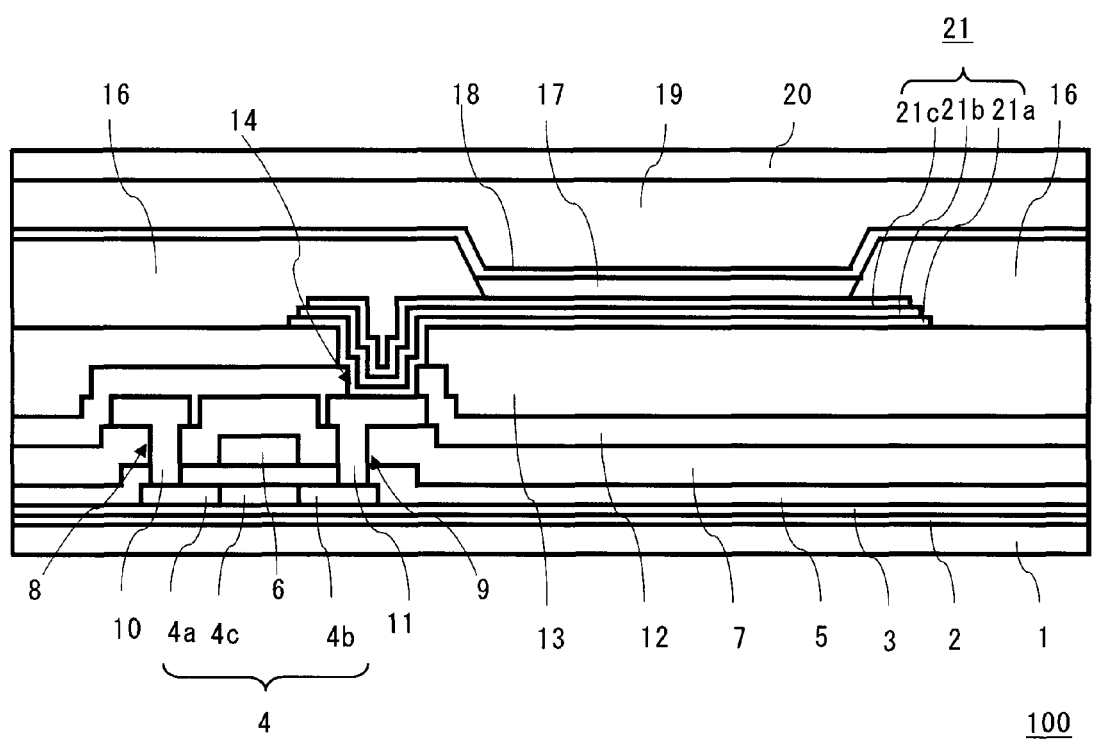
FIG. 9 is a diagram showing the structure of an organic electroluminescence type display apparatus according to a second embodiment of the present invention.

An organic electroluminescence type display apparatus according to a second embodiment of the present invention will be described with reference to FIG. 9. FIG. 9 is a cross-sectional view showing the structure of the organic electroluminescence type display apparatus according to this embodiment. The organic electroluminescence type display apparatus according to the second embodiment is different from that according to the first embodiment in that an anode 21 has a three-layer structure including a first Al alloy film 21a, a second Al alloy film 21b, and an amorphous ITO film 21c. Note that the same components as those of FIG. 3 are denoted by the same reference symbols in FIG. 9, and a description thereof is omitted.

As shown in FIG. 9, in this embodiment, the anode 21 is formed as at least a three-layer film in which the first Al alloy film 21a serving as the first anode, the second Al alloy film 21b serving as the second anode formed on the first anode, and the amorphous ITO film 21c serving as the third anode formed on the second anode are stacked on each other.

The first Al alloy film 21a contains as an impurity at least one kind of the Group 8 3d transition metals added to aluminum having a high light reflectance. The second Al alloy film 21b contains as an impurity at least one kind of the Group 8 3d transition metals, and contains oxygen added by reactive sputtering. Further, the second Al alloy film 21b has conductivity. Accordingly, on the interface between the second Al alloy film 21b and the amorphous ITO film 21c, no electrically insulating interface reaction product such as alumina exists.

Further, the composition ratio of impurities including at least one element selected the Group 8 3d transition metals in the first Al alloy film 21a is set within the range of 0.1 at % to 15 at %. Furthermore, the composition ratio of impurities including at least one kind of the Group 8 3d transition metals in the second Al Alloy film 21b is set within the range of 0.1 at % to 15 at %, and the composition ratio of oxygen is set within the range of 0.1 at % to 8 at %. Accordingly, as described in the first embodiment, since the light reflectance is high, the dark spots due to the reduction of the amorphous ITO film 21c do not occur.

As a method of manufacturing the anode 21, the first Al alloy film 21a is formed as the first anode of the anode 21. In this example, the Al alloy film 21a in which 2 at % of nickel is added to aluminum as an impurity was deposited with a thickness of 50 nm by the sputtering method using a target in which nickel (Ni) is added to aluminum (Al) and using argon (Ar) as a deposition gas.

Next, the second Al alloy film 21b is formed on the first Al alloy film 21a as the second anode of the anode 21. In this example, the second Al alloy film 21b in which 2 at % of nickel is added to aluminum as an impurity and 2 at % of oxygen is added and which has conductivity, was deposited with a thickness of 10 nm by reactive sputtering using a target in which nickel (Ni) is added to aluminum (Al) and using a deposition gas in which oxygen (O) is mixed with argon (Ar) as an impurity. Subsequently, the amorphous ITO film 21c, which is a light-transmitting conductive oxide film, was deposited as the third anode of the anode 21 with a thickness of 20 nm on the second Al alloy film 21b.

After that, a resist film having a predetermined opening pattern is formed on the anode 21 by the photolithography process. The anode 21 is etched using the resist film as a mask, thereby forming the anode 21 having the three-layer structure of the first Al alloy film 21a, the second Al alloy film 21b, and the amorphous ITO film 21c each having a desired pattern.

The first anode of the anode 15 has a single layer structure of the Al alloy film 15a in the first embodiment. The same effects can be obtained even if the first anode has a stacked structure in which the second Al alloy film 21b, which contains as an impurity at least one kind of the Group 8 3d transition metals to be added to aluminum and contains oxygen added by reactive sputtering and which has conductivity, is formed as an upper layer, in the same manner as the second embodiment.

Note that the thickness of the second Al alloy film 21b, which contains oxygen and has conductivity, is 10 nm, but the thickness is not limited thereto, as long as the thickness is in the range of 3.5 nm to 200 nm. If the thickness is equal to or greater than 3.5 nm, the reduction of the amorphous ITO film 21c, which is a transparent conductive film, due to Ni can be suppressed, and the occurrence of defective display due to dark spots can be prevented. Further, as the thickness of the Al alloy film increases, the grain size increases and the surface irregularities become larger. Thus, when the Al alloy film is used as the anode of the organic electroluminescence type display apparatus, defective coating is caused by the electroluminescence layer 17, which leads to a short mode failure with the cathode 18, for example. As for the target of the surface smoothness of the anode 21, it is preferable that the average roughness Ra be equal to or smaller than 1.0 nm. From this viewpoint, it is preferable that the thickness of the second Al alloy film 21b be equal to or smaller than 200 nm.

Though the second Al alloy film 21b is formed by the reactive sputtering method using a target in which nickel is added to aluminum and using a deposition gas in which oxygen is mixed with argon as an impurity in the above embodiment, the method of forming the second Al alloy film 21b is not limited thereto. For example, the same effects can be obtained even if the second Al alloy film 21b is formed by the sputtering method using a target in which the Group 8 3d transition metal and oxygen are added to Al and using Ar as deposition gas, the same effects can be obtained.

Note that, in this case, it is necessary to use individual targets for forming the first Al alloy film 21a serving as the first anode and the second Al alloy film 21b serving as the second anode. The use of reactive sputtering enables the formation of both the first anode and the second anode with the same target, which results in an improvement in productivity.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An organic electroluminescence type display apparatus comprising:
    a thin film transistor formed on a substrate; and
    an organic electroluminescence (EL) device connected to the thin film transistor and including at least an anode, an electroluminescence layer, and a cathode stacked on each other in this order,
    wherein the anode comprises:
        an Al alloy film having conductivity and including at least one kind of Group 8 3d transition metals, and oxygen, the at least one kind of the Group 8 3d transition metals and the oxygen being added to aluminum; and
        a transparent conductive film formed on the Al alloy film.

2. The organic electroluminescence type display apparatus according to claim 1, wherein:
    a composition ratio of the at least one kind of the Group 8 3d transition metals to be added to the Al alloy film is in a range of 0.1 at % to 15 at %; and
    the transparent conductive film comprises a metal oxide as a main component.

3. The organic electroluminescence type display apparatus according to claim 1, wherein a composition ratio of the oxygen added to the Al alloy film is in a range of 0.1 at % to 8 at %.

4. The organic electroluminescence type display apparatus according to claim 1, wherein the Al alloy film further comprises at least one rare earth element selected from the group consisting of Y, La, Ce, Pr Nd, Sm, Gd, Tb, Dy, Ho, and Er.

5. The organic electroluminescence type display apparatus according to claim 4, wherein a total composition ratio of the at least one rare earth element selected from the group consisting of Y, La, Ce, Pr, Nd, Sm, Gd, Tb, Dy, Ho, and Er to be added to the Al alloy film is equal to or greater than 0.1 at % and less than 15 at %.

6. The organic electroluminescence type display apparatus according to claim 1, wherein the Al alloy film has a thickness within a range of 10 nm to 200 nm.

7. A method of manufacturing an organic electroluminescence type display apparatus, the organic electroluminescence type display apparatus comprising: a thin film transistor formed on a substrate; and an organic EL device connected to the thin film transistor and including at least an anode, an electroluminescence layer, and a cathode stacked on each other in this order, the method comprising the step of forming the anode,
    wherein the step of forming the anode comprises the steps of:
        forming an Al alloy film having conductivity and including at least one kind of Group 8 3d transition metals, and oxygen, the at least one kind of the Group 8 3d transition metals and the oxygen being added to aluminum; and
        forming a transparent conductive film on the Al alloy film.

8. The method of manufacturing an organic electroluminescence type display apparatus according to claim 7, wherein the Al alloy film is formed by a sputtering method using a mixed gas of argon and oxygen.

9. The method of manufacturing an organic electroluminescence type display apparatus according to claim 8, wherein:
    the Al Alloy film is formed by the sputtering method using an Al alloy sputtering target including a Group 8 3d transition metal added to aluminum with a composition ratio within a range of 0.1 at % to 15 at %; and
    the transparent conductive film comprises a metal oxide as a main component.

10. The method of manufacturing an organic electroluminescence type display apparatus according to claim 7, wherein the Al alloy film is formed with a composition ratio of the oxygen added to the Al alloy film being set within a range of 0.1 at % to 8 at %.

11. The method of manufacturing an organic electroluminescence type display apparatus according to claim 7, wherein the Al alloy film is formed by the sputtering method using an Al alloy sputtering target including at least one kind of the Group 8 3d transition metals, and oxygen, the at least one kind of the Group 8 3d transition metals and the oxygen being added to aluminum.

12. The method of manufacturing an organic electroluminescence type display apparatus according to claim 11, wherein:
    the Al Alloy sputtering target includes a Group 8 3d transition metal added to aluminum with a composition ratio within a range of 0.1 at % to 15 at %; and the transparent conductive film comprises a metal oxide as a main component.

13. The method of manufacturing an organic electroluminescence type display apparatus according to claim 11, wherein the Al Alloy sputtering target includes oxygen added with a composition ratio within a range of 0.1 at % to 8 at %.

14. The method of manufacturing an organic electroluminescence type display apparatus according to claim 7, wherein the Al alloy film is formed using an Al alloy sputtering target, the Al alloy sputtering target including at least one kind of the Group 8 3d transition metals to be added to aluminum and further including at least one rare earth element selected from the group consisting of Y, La, Ce, Pr, Nd, Sm, Gd, Tb, Dy, Ho, and Er.

15. The method of manufacturing an organic electroluminescence type display apparatus according to claim 14, wherein a total composition ratio of the at least one rare earth element selected from the group consisting of Y, La, Ce, Pr, Nd, Sm, Gd, Tb, Dy, Ho, and Er to be added to the Al alloy film is equal to or greater than 0.1 at % and less than 15 at %.

16. The method of manufacturing an organic electroluminescence type display apparatus according to claim 7, wherein the Al alloy film is formed with a thickness within a range of 10 nm to 200 nm.

17. The method of manufacturing an organic electroluminescence type display apparatus according to claim 1, wherein the anode is formed below the Al alloy film and further comprises an Al alloy film including at least one kind of Group 8 3d transition metals to be added to aluminum.

* * * * *